United States Patent [19]

Knox et al.

[11] Patent Number: 4,978,910
[45] Date of Patent: Dec. 18, 1990

[54] ELECTROOPTIC APPARATUS FOR THE MEASUREMENT OF ULTRASHORT ELECTRICAL SIGNALS

[75] Inventors: Wayne H. Knox, Rumson; David A. B. Miller, Fair Haven, both of N.J.

[73] Assignee: AT&T Bell Laboratories, Murray Hill, N.J.

[21] Appl. No.: 371,475

[22] Filed: Jun. 26, 1989

[51] Int. Cl.$^5$ .................. G01R 31/00; H01L 27/14
[52] U.S. Cl. .................. 324/96; 324/158 R; 324/158 D; 324/77 K; 357/30; 357/4
[58] Field of Search .................. 324/77 K, 96, 158 R, 324/158 D; 357/4, 16, 30 R, 30 Q; 332/7.51; 455/607; 350/96.14, 356

[56] References Cited

U.S. PATENT DOCUMENTS

| | | | |
|---|---|---|---|
| 4,446,425 | 5/1984 | Valdmanis et al. | 324/77 K |
| 4,482,863 | 11/1984 | Auston et al. | 324/158 D |
| 4,525,687 | 6/1985 | Chemla et al. | 357/16 |
| 4,603,293 | 7/1986 | Mourou et al. | 324/96 |
| 4,618,819 | 10/1986 | Mourou et al. | 324/77 K |
| 4,716,449 | 12/1987 | Miller | 354/4 |
| 4,806,997 | 2/1989 | Simmons et al. | 357/16 |

OTHER PUBLICATIONS

Knox et al., Appl. Phys. Lett., 48 (13), 1986, "Subpicosecond Excitonic Electroabsorption . . . ", pp. 864–866.
Miller et al., Physical Review B, vol. 32, No. 2, 1985, "Electric Field Dependence of Optical . . . ", pp. 1043–1060.
Valdmanis et al., IEEE J. of Quantum Elec., vol. QE-22, No. 1, 1986, "Subpicosecond Electrooptic Sampling: Principles . . . ", pp. 69–78.
D. H. Auston, Appl. Phys. Lett., vol. 37, No. 4, 1980, "Picosecond Optoelectronic Detection, Sampling, . . . ", pp. 371–373.

*Primary Examiner*—Reinhard J. Eisenzopf
*Assistant Examiner*—Vinh P. Nguyen
*Attorney, Agent, or Firm*—Gregory C. Ranieri; John G. de la Rosa

[57] ABSTRACT

An electrooptic measuring apparatus having both high voltage sensitivity and femtosecond time resolution includes coplanar transmission lines fabricated on a semi-insulating multiple quantum well structure. An electrical signal, such as from a high speed electronic device, injected onto the transmission lines creates an electrical field parallel to the layer planes of the multiple quantum well structure. Excitonic electroabsorption by the multiple quantum well structure, in response to the parallel field, changes the transmissivity of the multiple quantum well structure. An external light beam directed through the multiple quantum well structure is modulated by the changes in transmissivity. By detecting this modulation, a sampling of the electrical signal is achieved.

10 Claims, 4 Drawing Sheets

ELECTROOPTIC APPARATUS FOR THE MEASUREMENT OF ULTRASHORT ELECTRICAL SIGNALS

TECHNICAL FIELD

This invention relates to the field of measurement of electrical signals and, more particularly, to the measurement of ultrashort electrical signals by electrooptic sampling.

BACKGROUND OF THE INVENTION

State of the art electronic instruments, such as sampling oscilloscopes, cannot measure electrical signals with a sub-picosecond time resolution. Such measurements are required in characterizing today's state of the art electronic devices that operate in the commensurate time regime. Measurements can be made, however, with electrooptic instruments based on electrooptic sampling techniques.

Generally, electrooptic sampling techniques utilize ultrashort optical pulses in combination with an electrooptic phenomenon, such as photoconductivity or photoemission, to make jitter-free measurements of electrical signals which are present at internal nodes of electronic devices. Two main electrooptic sampling techniques which have been developed are based on either the Pockels effect or the photoconductive effect.

In electrooptic sampling based on the Pockels effect, an electrical signal propagating along a pair of conductive lines is measured by directing an optical beam through an electrooptic crystal (a crystal having a high electrooptic coefficient) that is placed adjacent to the pair of lines. A field-induced birefringence in the crystal, resulting from the electrical signal, changes the polarization of the optical beam as it propagates through the crystal. Cross polarizers in combination with photodetectors detect this change in polarization and, thus, measure electrical signal activity on the conductive pair of lines. See, for example, J. A. Valdmanis et al., *IEEE Journal of Quantum Electronics*, Vol. QE-22, No. 1, pp. 69–78 (1986); U.S. Pat. No. 4,446,425; and U.S. Pat. No. 4,618,819.

In contrast, electrooptic sampling based on the photoconductive effect utilizes two optical beams, a pump beam and a probe beam, to generate and to detect an electrical signal, respectively. The pump beam illuminates a first gap comprising photoconductive material between a biased transmission line and a main transmission line. Free carriers produced upon illuminating the first gap reduce the resistance of the material so that charge is transferred from the biased transmission line onto the main transmission line. This charge transfer results in an electrical signal being injected onto the main transmission line. The probe beam illuminates a second gap comprising photoconductive material at a delay time, $t+\tau$, between the main transmission line and a sampling electrode. This, in turn, diverts a portion of the charge on the main transmission line onto the sampling electrode. By integrating and averaging the diverted charge on the sampling electrode line as a function of $\tau$, the injected electrical signal can be measured without physically contacting the transmission lines. Furthermore, the injected electrical signal can be directed into an electronic device and the electronic response measured by the probe beam in a similar fashion as above. See, for example, D. H. Auston, *Appl. Phys. Lett.*, 37 (4) pp. 371–373 (1980); and U.S. Pat. No. 4,482,863.

Both electrooptic sampling techniques described above have become viable means for the measurement of ultrashort electrical signals. Although electrooptic sampling based on the Pockels effect has a higher temporal resolution (300 fsec) than photoconductive techniques (2 psec), the former has a lower voltage sensitivity and, in practice, requires an averaging of a high number of measurements for an acceptable signal to noise ratio to be achieved.

SUMMARY OF THE INVENTION

An electrooptic measuring apparatus having both high voltage sensitivity and femtosecond time resolution comprises coplanar transmission lines fabricated on a semi-insulating multiple quantum well structure. An electrical signal, such as from a high speed electronic device, injected onto the transmission lines creates an electrical field parallel to the layer planes of the multiple quantum well structure. Excitonic electroabsorption by the multiple quantum well structure, in response to the parallel field, changes the transmissivity of the multiple quantum well structure. An external light beam directed through the multiple quantum well structure is modulated, resulting from the changes in transmissivity. By detecting this modulation, a sampling of the electrical signal is achieved. Measurements indicate that the present electrooptic apparatus exhibits a comparable time resolution to instruments based on other electrooptic sampling techniques.

BRIEF DESCRIPTION OF THE DRAWING

The invention will be more readily understood after reading the following descriptions of specific illustrative embodiments of the invention in conjunction with the appended drawings wherein.

DETAILED DESCRIPTION

Figure 1:
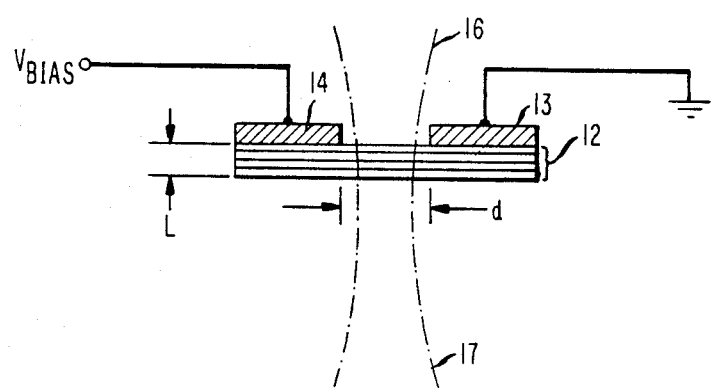
FIG. 1 shows a cross-sectional view of an exemplary embodiment of an electrooptic apparatus in accordance with the principles of the invention.

Both femtosecond time resolution and high voltage sensitivity of electrical signals are afforded by the exemplary electrooptic apparatus as shown in FIG. 1. The electrooptic apparatus comprises substantially parallel, coplanar striplines 13 and 14 (a type of coplanar transmission lines) fabricated on semi-insulating multiple quantum well structure 12. References made to a semi-insulating multiple quantum well structure is to be understood as a multiple quantum well structure comprising semiconductor material having a resistivity greater than $10^6 \Omega \cdot cm$. Coplanar striplines 13 and 14 which are electrically conductive are electrically biased at a high voltage, $V_{bias}$, with respect to each other by voltage source 11 via wire contacts 1 and 2. Striplines 13 and 14 are long enough to insure that any electrical reflection from a terminated end of the striplines occurs at a sampling point long after the initial rise of an electrical signal.

Figure 2:
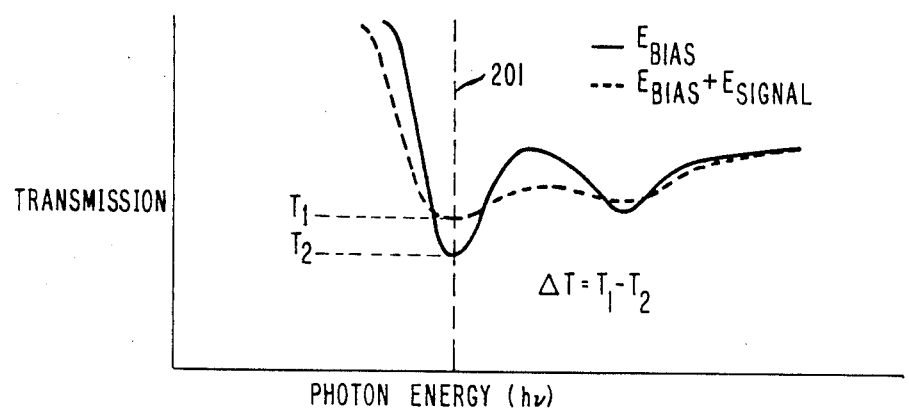
FIG. 2 is a graph showing a variation in transmission with photon energy for two different levels of applied electrical fields.

The operation of the electrooptic apparatus is best understood by referring to both FIGS. 1 and 2. A bias electrical field, $E_{bias}=V_{bias}/d$, is created parallel to the layer planes of multiple quantum well structure 12 by bias voltage that is applied between striplines 13 and 14. Under this bias electric field, multiple quantum well structure 12 has a transmissivity, $T_1$, at photon energy 201 which corresponds to the position of its excitonic resonance peak. It is noted that the transmissivity, T, is related to the absorption coefficient, $\alpha$, by the following relationship: $T=e^{-\alpha L}$, where L is the thickness of the quantum well structure. Hence, reference made to transmissivity is to be understood to encompass a reference in the alternative to the absorption coefficient, $\alpha$, vis-a-vis the relationship above.

An electrical signal, for example, injected from an output terminal of an electronic device onto striplines 13 and 14 produces a perturbation, $E_{signal}$, in the bias electrical field. As a result, a perturbed electrical field, $E_{bias}+E_{signal}$, is generated, causing the excitonic resonance peak to broaden via the excitonic electroabsorption effect. Excitonic electroabsorption is caused by a reduction in lifetime of excitons due to field ionization and is fully discussed in the following references: W. H. Knox et al., *Appl. Phys. Lett.*, 48 (13), pp. 864–866 (1986); and D. A. B. Miller et al., *Physical Review B*, 32 (2), pp. 1043–1060 (1985). The broadening of the excitonic resonance peak due to the perturbed electrical field, $E_{bias}+E_{signal}$, changes the transmissivity of multiple quantum well structure 12 from $T_1$ to $T_2$ at photon energy 201. Therefore, an optical beam at photon energy 201 directed through multiple quantum well structure 12 experiences an optical modulation which varies in time with the amplitude of the injected electrical signal. For example, in FIG. 1, light beam 16 experiences optical modulation, $T_1-T_2/T_1$. Furthermore, the optical modulation which can be observed in light beam 17 is due to changes in transmissivity of multiple quantum well structure 12. Moreover, the optical modulation of light beam 17 can be processed by external circuitry such as photodectors in combination with sampling gates to measure electrical signal activity on stripline 13 and 14.

Conductive materials such as metals are selected for use as coplanar stripline 13 and 14. The choice of material is predicated upon factors such as resistivity and ease of fabrication, as well as other factors. Thicknesses for the striplines are chosen to be sufficient to lower the series resistance for electrical signals to propagate along the striplines. Thicknesses of the striplines must also be made in conjunction with such considerations for stripline width and interline spacing because the width and the spacing not only determine the line impedance, but also the dispersion characteristics of the striplines. Apposite to the consideration of the interline spacing is the fact that the sensitivity of the apparatus is proportional to the bias electrical field. Hence, small spacings establish higher electrical fields for a given bias voltage and, consequently, afford greater voltage sensitivity.

The electrooptic apparatus in FIG. 1 may be fabricated, for example, by molecular beam epitaxy growth technique in conjunction with standard stripline microfabrication techniques. The electrooptic apparatus in FIG. 3 maybe substituted for the apparatus in FIG. 1. For the electrooptic apparatus shown in FIG. 3, the fabrication process is as follows. Stop etch layer 31, a 1.97 μm thickness $GaAl_{0.3}As_{0.7}$ layer, is grown over a semi-insulating chromium doped GaAs substrate (not shown). Multiple quantum well structure 32 is grown on top of stop etch layer 31 and proton-implanted with 300 KeV $H^+$ ions and, then, 100 KeV $H^+$ ions. The energy and the dose of the implant were carefully chosen to create semi-insulating multiple quantum wells within multiple quantum well structure 32. It is extremely important that the wells be sufficiently semi-insulating to afford low power dissipation so as to prevent ohmic heating from damaging the multiple quantum wells under high electric fields. Protonimplantation of multiple quantum well structure 32 reduces the carrier recombination time therein to approximately 50 ps, but does not broaden the exciton resonance peak excessively. Subsequently, 10 μm wide, gold striplines 33 and 34 having a thickness of 2000 Å and an interline spacing of 10 μm were evaporated on top of multiple quantum well structure 32.

Multiple quantum well structure 32 comprises 50 periods of 69.3 Å $Al_{0.32}Ga_{0.68}As$ barrier layers and 72.25 Å quantum well layers. The quantum well layers themselves consist of a five period superlattice: 11.5 Å GaAs layers and 2.95 Å $Al_{0.32}Ga_{0.68}As$ layers. The GaAs substrate is opaque at the wavelength of interest and therefore must be removed. Using standard chemical etching techniques, the semi-insulating GaAs substrate is removed through stop etch layer 31. This effectively leaves striplines 33 and 34 free-standing on a thin film structure comprised of stop etch layer 31 and multiple quantum well structure 32. The thin film structure has a low effective dielectric constant (i.e. low dispersion and radiative losses) which facilitates the propagation of high frequency signals along striplines 33 and 34. See, for example, G. Hasnain et al. *IEEE Trans. Microwave Theory Tech.*, Vol. MTT-34, p. 738 (1986). The entire structure is mounted on quartz substrate 30. Wire contacts, not shown, are placed on striplines 33 and 34 in order to facilitate applying a bias voltage parallel to the layer planes of multiple quantum well structure 32.

Figure 3:
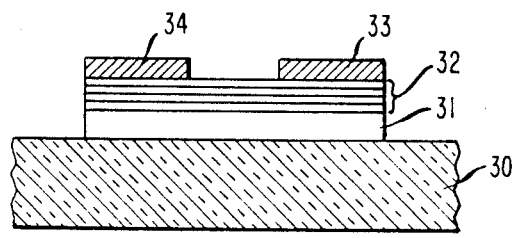
FIG. 3 shows a cross-sectional view of a second exemplary embodiment of the electrooptic apparatus.
Figure 4:
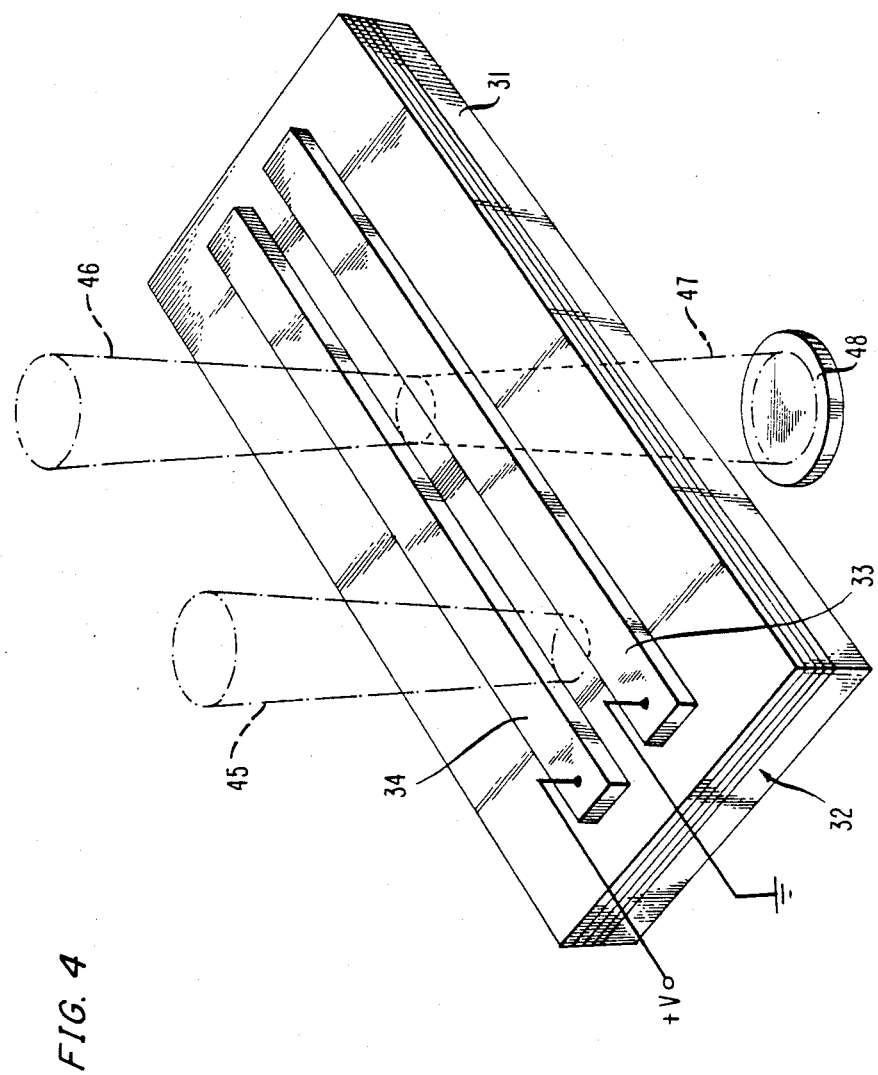
FIG. 4 shows a perspective view of an embodiment of the electrooptic apparatus for measuring an electrical signal that is generated via a photoconductive switch.

Illustrated in FIG. 4 is an example from experimental practice utilizing the electrooptic apparatus of FIG. 3 for measuring an electrical signal generated by a photoconductive switch. Voltage sensitivity was maximized by observing a transmission change spectrum of multiple quantum well structure 32 obtained with a bias voltage of 0 and 40 volts followed by temperature tuning the exciton resonance peak wavelength of multiple quantum well structure 32 to the wavelength of light beam 45 with a thermo-electric device. In this case, the temperature of multiple quantum well structure 32 was set at 5° C. above ambient temperature and striplines 33 and 34 were biased by voltage source 11 at 40 volts with respect to each other in order to establish a bias electric field of $4\times10^4$ V cm$^{-1}$.

Figure 5:
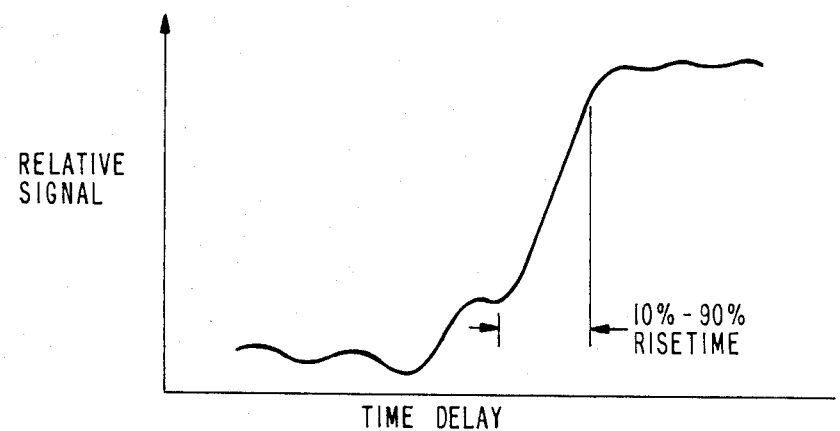
FIG. 5 is a graph of the relative signal intensity versus time delay.
Figure 7:
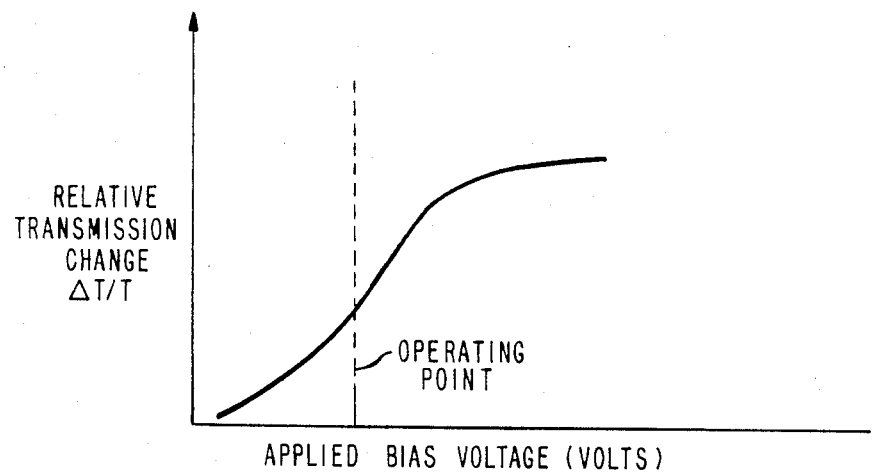
FIG. 7 shows a graph illustrating a variation in transmission with applied bias voltage for a particular photon energy.

An infrared dye laser operating at a wavelength of 805 nm (photon energy $h\nu=1.51$ eV) and a repetition rate of 82 MHz was used as an optical source of femtosecond pulses. Moreover, these femtosecond pulses were chopped at a 1 KHz rate and used as switching beam 45 (~2 mw) to generate rapid changes in the bias electrical field parallel to the layer planes of multiple quantum well structure 32. That is, switching beam 45 illuminated a 15 μm diameter area diameter, photoconductive area 48 between striplines 33 and 34 result in the formation of a high density electron-hole plasma ($\sim 10^{18} cm^{-3}$) which temporarily shorted out the bias electrical field. Thus, injecting between striplines 33 and 34 a transient electrical signal corresponding to about a 200 mV peak signal. This transient signal was detected after 0.3 mm of propagation by passing weak probe beam 46 ($\sim 0.02$ mw), derived from the switching beam, through multiple quantum well structure 32 and between striplines 33 and 34. Transmitted probe beam 47 was detected by photodetector 48 in combination with a lock-in amplifier. The relative intensity signal of transmitted probe beam 47 was measured at variable time delays from the start of switching beam 45. A 10%–90% risetime of 500 fs, as shown in FIG. 5, was observed after averaging ten consecutive measurements.

Since the recovery of the field or the fall time is governed in this particular experiment by electron-hole recombinations and expected to occur on a longer time scale, it was not measured in this case. Also, it is expected that a time resolution of 100 fs may be possible with shorter laser pulses. Saturation of the excitonic electroabsorption which could limit the response time was not present considering the low power of probe beam 46.

Figure 6:
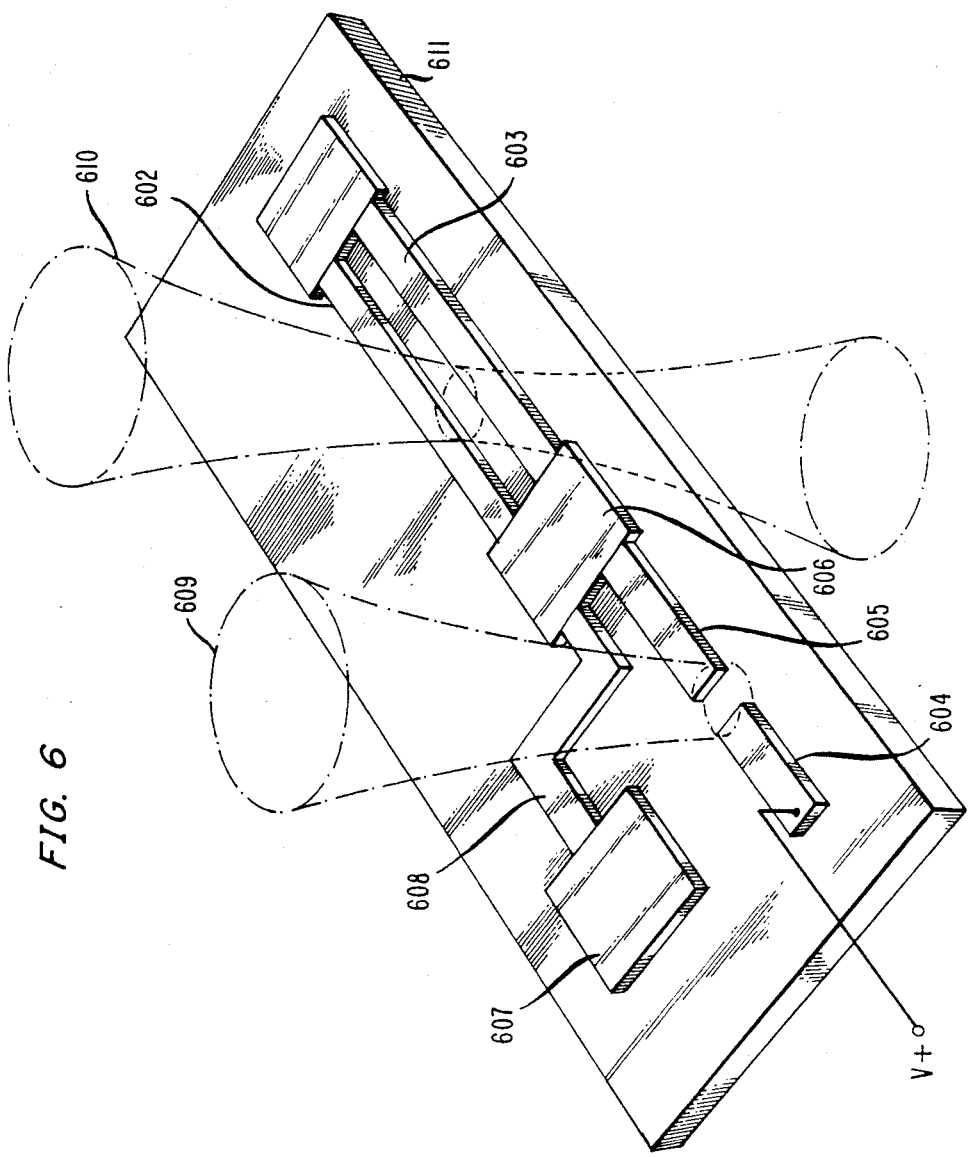
FIG. 6 shows an integration of the electrooptic apparatus with a device on a semiconductor substrate.

FIG. 6 illustrates an exemplary embodiment of the invention for measuring the electronic response of device 606 which is fabricated on GaAs substrate 611. A semi-insulating multiple quantum well structure, not shown, having the same structure as multiple quantum well structure 32, shown in FIG. 3, is fabricated beneath striplines 602 and 603 without supporting layers 30 and 31. Striplines 602 and 603 are connected to a bias voltage, $V_{bias}$, and the output terminal of device 606, respectively. Stripline 604 is separated from stripline 605 by a gap 612 comprising photoconductive material, that is, a photoconductive switch. When gap 612 between striplines 604 and 605 is illuminated by optical pulses 609, having an appropriate wavelength, photoconductivity causes an electrical signal to be injected onto stripline 605 which travels into device 606. The output pulse from device 606 is sampled at the output terminal by delayed optical pulse 610 illuminating a region between striplines 602 and 603 that includes a region of the semi-insulating multiple quantum well structure. By measuring the modulation of the delayed optical pulses as a function of a delay time, $\tau$, between optical pulses 609 and 610, the electronic response of device 606 is measured.

The electrical pulse injected into device 606 via stripline 605 may also be directly injected by another device, such as from device 607 via stripline 608. Furthermore, the electrical pulses injected onto stripline 605 may instead be a repetitive elecctrical signal. In this case, a repetitive electrical signal on the output terminal of device 606 will be measured. Devices 606 and 607 are not limited to being discrete electronic devices, but may also be integrated circuits, optoelectronic devices or the like.

As described above, a bias voltage was applied between the coplanar striplines to set the operating point of the semi-insulating multiple quantum well structure. Defining $\Delta T$ as $T|V=V_{bias}-T|v=0$, then, the relative change in transmission $\Delta T/T$, indicative of the sensitivity, is highly dependent on the bias voltage as indicated by FIG. 6. Moreover, the relative transmissivity change correspondingly increases with the applied bias electrical field. Although enhanced sensitivity is achieved by a high biasing of the coplanar striplines, it should be possible to measure electrical signals with a low bias voltage. Such an operating mode, though, would reduce the voltage sensitivity of the apparatus.

While the description above is based on transparent or partially transparent semiconductor layers for the apparatus to operate in a transmissive mode, it is expected that the same apparatus will operate in a reflective mode by adding a reflective surface or coating to the bottom surface of the multiple quantum well structure. It should be noted that in this case, the photodetector is positioned on the same side as probe beam 47.

Also, other semiconductor quantum well systems, other than the GaAs/GaAlAs utilized in the above embodiments, such as InGaAs/InAlAs, InGaAs/InP and GaSb/AlGaSb, may be selected.

It is understood that the embodiments described herein are merely illustrative of the principles of the invention. It is expected that the principles of the invention are applicable not only to the exemplary apparatus herein utilizing coplanar striplines, but also to those apparatuses using other types of coplanar transmission lines such as coplanar waveguides. For a discussion of coplanar waveguides, see Gupta et al., *Microstripline and Slot Lines*, Chapter 7, (1979).

Also, various other modifications may be made by those skilled in the art which will embody the principles of the invention and fall within the spirit and the scope thereof. For instance, femtosecond lasers operating at different wavelengths could be used as the probe beam if the layer thickness and/or material composition within the multiple quantum well structure is correspondingly adjusted in order to match the exciton resonance peak wavelength to the specific wavelength of the laser.

We claim:

1. An electrooptic apparatus for measuring a characteristic of an electrical signal comprising:
   a multiple quantum well structure comprising substantially semi-insulating semiconductor material;
   first and second coplanar transmission lines positioned over said multiple quantum well structure;
   means for contacting a fixed electrical potential between said first and second coplanar transmission lines;
   means for illuminating by an optical beam a region between said first and second coplanar transmission line that substantially includes said multiple quantum well structure; and
   means for injecting said electrical signal between said coplanar transmission lines, said multiple quantum well structure responsive to variations in amplitude of said electrical signal for modulating a characteristic of said optical beam to produce a modulated optical beam.

2. The electrooptic apparatus as defined in claim 1 wherein said coplanar transmission lines include coplanar striplines.

3. The electrooptic apparatus as defined in claim 1 wherein said coplanar transmission lines include coplanar waveguides.

4. The electrooptic apparatus as defined in claim 1 further comprising detecting means for responding to said modulated optical beam.

5. The electrooptic apparatus as defined in claim 4 wherein said means for injecting includes a photoconductive switch.

6. The electrooptic apparatus as defined in claim 4 wherein said electrical signal is generated by an electronic device.

7. The electrooptic apparatus as defined in claim 6 wherein said electronic device and said multiple quantum well structure are fabricated on a single common semiconductor substrate.

8. The electrooptic apparatus as defined in claim 1 wherein said multiple quantum well structure includes said semiconductor material having a resistivity greater than $10^6 \Omega \cdot cm$.

9. The electrooptic apparatus as defined in claim 1 wherein said means for illuminating includes a laser for generating said optical beam.

10. The electrooptic apparatus as defined in claim 1 wherein said multiple quantum well structure includes said semiconductor material consisting of group III-V compounds selected from GaAs/GaAlAs, InGaAs/InP, InGaAs/InAlAs and GaSb/AlGaSb systems.

* * * * *